United States Patent
Yang

(10) Patent No.: US 12,145,955 B2
(45) Date of Patent: Nov. 19, 2024

(54) CYCLIC AZASTANNANE AND CYCLIC OXOSTANNANE COMPOUNDS AND METHODS FOR PREPARATION THEREOF

(71) Applicants: Gelest, Inc., Morrisville, PA (US); Mitsubishi Chemical Corporation, Tokyo (JP)

(72) Inventor: Li Yang, Belle Mead, NJ (US)

(73) Assignees: GELEST, INC., Morrisville, PA (US); MITSUBISHI CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 18/373,404

(22) Filed: Sep. 27, 2023

(65) Prior Publication Data

US 2024/0124500 A1    Apr. 18, 2024

Related U.S. Application Data

(60) Provisional application No. 63/412,959, filed on Oct. 4, 2022.

(51) Int. Cl.
C07F 7/22    (2006.01)

(52) U.S. Cl.
CPC .................................. C07F 7/2288 (2013.01)

(58) Field of Classification Search
None
See application file for complete search history.

(56) References Cited

U.S. PATENT DOCUMENTS

| | | |
|---|---|---|
| 2,592,926 A | 4/1952 | Mack et al. |
| 2,602,651 A | 7/1952 | Cannon |
| 3,417,116 A | 12/1968 | Considine et al. |
| 3,470,220 A | 9/1969 | Moedritzer et al. |
| 3,519,666 A | 7/1970 | Pellegrini et al. |
| 3,590,060 A | 6/1971 | Murch |
| 3,976,672 A | 8/1976 | Strunk et al. |
| 4,370,028 A | 1/1983 | Bernhardt |
| 4,556,725 A | 12/1985 | Kanner et al. |
| 4,696,837 A | 9/1987 | Lindner |
| 5,123,998 A | 6/1992 | Kishimura |
| 5,274,149 A | 12/1993 | Calbick et al. |
| 5,698,262 A | 12/1997 | Soubeyrand et al. |
| 6,022,822 A * | 2/2000 | Noyori ................ B01J 31/1805 556/89 |
| 6,162,756 A | 12/2000 | Friebe et al. |
| 6,271,329 B1 | 8/2001 | Kristen et al. |
| 6,861,544 B1 | 3/2005 | Curran et al. |
| 6,984,591 B1 | 1/2006 | Buchanan et al. |
| 7,045,451 B2 | 5/2006 | Shenai-Khatkhate |
| 7,384,872 B2 | 6/2008 | Hwang et al. |
| 7,413,776 B2 | 8/2008 | Shenai-Khatkhate et al. |
| 7,683,004 B2 | 3/2010 | Feldman et al. |
| 7,745,102 B2 | 6/2010 | Fedynyshyn et al. |
| 7,767,840 B2 | 8/2010 | Shenai-Khatkhate et al. |
| 7,919,423 B2 | 4/2011 | Feldman et al. |
| 8,008,518 B2 | 8/2011 | Shinohata et al. |
| 8,415,000 B2 | 4/2013 | Stowers et al. |
| 8,454,928 B2 | 6/2013 | Dussarrat |
| 8,563,231 B2 | 10/2013 | Wang et al. |
| 8,901,335 B2 | 12/2014 | Modtland et al. |
| 9,085,594 B2 | 7/2015 | Modtland et al. |
| 9,310,684 B2 | 4/2016 | Meyers et al. |
| 10,732,505 B1 | 8/2020 | Meyers et al. |
| 10,787,466 B2 | 9/2020 | Edson et al. |
| 10,862,199 B1 | 12/2020 | Zhang et al. |
| 11,079,676 B2 | 8/2021 | Asano et al. |

(Continued)

FOREIGN PATENT DOCUMENTS

| | | |
|---|---|---|
| CA | 3080934 A1 | 10/2019 |
| CN | 102212079 A | 10/2011 |

(Continued)

OTHER PUBLICATIONS

Davies Organotin Chemistry, 2nd, Completely Revised and Updated Edition, 2003, Wiley, pp. 266-267.*
Haaland "Covalent versus Dative Bonds to Main Group Metals a Useful Distinction" Angewandte Chemie Internation Edition English, 1989, vol. 28, pp. 992-1007.*
Yoder et al. "Amination and Transamination as Routes to Fourth Group Diamines" Journal of the American Chemical Society, 1966, vol. 88, No. 21, pp. 4831-4839.*
Elhamzaoui, H, et al. Chem. Commun., 2006, 1304-1306 (Year: 2006).*
Ossig et al. "Synthesis and X-ray crystal structure of a stannaimine" Journal of the Chemical Society, Chemical Communications, pp. 497-499 (Year: 1993).*

(Continued)

*Primary Examiner* — Matthew P Coughlin
*Assistant Examiner* — Quincy A McKoy
(74) *Attorney, Agent, or Firm* — Panitch Schwarze Belisario & Nadel LLP

(57) ABSTRACT

Cyclic azastannanes and cyclic oxostannanes having formulas (I) and (II) where X is an alkoxy or dialkylamino group are a new class of cyclic compounds. These compounds have desirably high vapor pressure and high purity (containing low levels of polyalkyl contaminants after purification), and have particular interest for EUV photoresist applications. Methods for preparing these compounds are described.

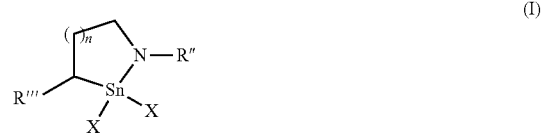

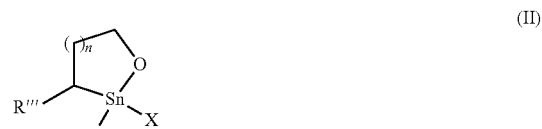

10 Claims, No Drawings

(56) References Cited

U.S. PATENT DOCUMENTS

| | | |
|---|---|---|
| 11,156,915 B2 | 10/2021 | Tsubaki et al. |
| 11,459,656 B1 | 10/2022 | Arkles et al. |
| 11,500,284 B2 | 11/2022 | Meyers et al. |
| 11,697,660 B2 | 7/2023 | Kuiper et al. |
| 2001/0001796 A1 | 5/2001 | Lynch et al. |
| 2003/0015249 A1 | 1/2003 | Jursich |
| 2004/0077892 A1 | 4/2004 | Arkles et al. |
| 2004/0202956 A1 | 10/2004 | Takahashi et al. |
| 2009/0155546 A1 | 6/2009 | Yamashita et al. |
| 2010/0270296 A1 | 10/2010 | Rauleder et al. |
| 2011/0070371 A1 | 3/2011 | Gessert et al. |
| 2011/0166268 A1 | 7/2011 | Deelman et al. |
| 2011/0171382 A1 | 7/2011 | Gardiner et al. |
| 2011/0212629 A1 | 9/2011 | Ivanov et al. |
| 2011/0251354 A1 | 10/2011 | Marechal |
| 2012/0070613 A1 | 3/2012 | Stowers et al. |
| 2012/0223418 A1 | 9/2012 | Stowers et al. |
| 2014/0119977 A1 | 5/2014 | Gatineau et al. |
| 2015/0056542 A1 | 2/2015 | Meyers et al. |
| 2015/0064839 A1 | 3/2015 | Choi et al. |
| 2015/0221519 A1 | 8/2015 | Marks et al. |
| 2016/0116839 A1 | 4/2016 | Meyers et al. |
| 2017/0102612 A1 | 4/2017 | Meyers et al. |
| 2019/0310552 A1 | 10/2019 | Asano et al. |
| 2019/0315781 A1 | 10/2019 | Edson et al. |
| 2019/0337969 A1 | 11/2019 | Odedra et al. |
| 2019/0354010 A1 | 11/2019 | Minegishi et al. |
| 2019/0391486 A1 | 12/2019 | Jiang et al. |
| 2020/0239498 A1 | 7/2020 | Clark et al. |
| 2020/0241413 A1 | 7/2020 | Clark et al. |
| 2020/0348591 A1 | 11/2020 | Kim et al. |
| 2020/0356000 A9 | 11/2020 | Minegishi et al. |
| 2021/0013034 A1 | 1/2021 | Wu et al. |
| 2021/0214379 A1 | 7/2021 | Odedra et al. |
| 2022/0153763 A1 | 5/2022 | Ermert et al. |
| 2022/0187705 A1 | 6/2022 | Jiang et al. |
| 2022/0242888 A1 | 8/2022 | Kuiper et al. |
| 2022/0402945 A1 | 12/2022 | Ermert et al. |
| 2022/0402946 A1 | 12/2022 | Sim et al. |
| 2023/0095666 A1 | 3/2023 | Arkles et al. |
| 2023/0203068 A1 | 6/2023 | Pan et al. |
| 2023/0279546 A1 | 9/2023 | Arkles et al. |
| 2023/0303596 A1 | 9/2023 | Ermert et al. |
| 2023/0391804 A1 | 12/2023 | Yang et al. |
| 2024/0116957 A1 | 4/2024 | Yang |
| 2024/0158422 A1 | 5/2024 | Yang et al. |

FOREIGN PATENT DOCUMENTS

| | | |
|---|---|---|
| CN | 103172653 A | 6/2013 |
| EP | 1166900 A2 | 1/2002 |
| EP | 1491492 A1 | 12/2004 |
| EP | 1760085 A1 | 3/2007 |
| EP | 1983073 A1 | 10/2008 |
| JP | 2002371084 A | 12/2002 |
| JP | 2006159090 A | 6/2006 |
| JP | 2008-091215 A | 4/2008 |
| JP | 2012203061 A | 10/2012 |
| JP | 2013143527 A | 7/2013 |
| JP | 2020122959 A | 8/2020 |
| JP | 2021-528536 A | 10/2021 |
| KR | 20210103950 A | 8/2021 |
| TW | 223619 B | 5/1994 |
| TW | 201831570 A | 9/2018 |
| TW | 202006168 A | 2/2020 |
| TW | 1752308 B | 1/2022 |
| TW | 202230049 A | 8/2022 |
| TW | 202246293 A | 12/2022 |
| WO | 8607615 A1 | 12/1986 |
| WO | 8705037 A1 | 8/1987 |
| WO | 0195690 A1 | 12/2001 |
| WO | 0214328 A1 | 2/2002 |
| WO | 2003091186 A2 | 11/2003 |
| WO | 2009138474 A1 | 11/2009 |
| WO | 2012012026 A2 | 1/2012 |
| WO | 2013143745 A1 | 10/2013 |
| WO | 2013172466 A1 | 11/2013 |
| WO | 2014025937 A1 | 2/2014 |
| WO | 2017066319 A2 | 4/2017 |
| WO | 2017156388 A1 | 9/2017 |
| WO | 2018031896 A1 | 2/2018 |
| WO | 2018123388 A1 | 7/2018 |
| WO | 2018139109 A1 | 8/2018 |
| WO | 2019199467 A1 | 10/2019 |
| WO | 2020102085 A1 | 5/2020 |
| WO | 2020264557 A1 | 12/2020 |
| WO | 2022046736 A1 | 3/2022 |
| WO | 2022165381 A1 | 8/2022 |
| WO | 2023235534 A1 | 12/2023 |

OTHER PUBLICATIONS

International Search Report and Written Opinion issued Oct. 5, 2023 in Int'l Application No. PCT/US2023/024227.

Lorberth et al., "Evidence for Sn—N pi-Bonding: Dipole Moments of Aminostannanes," Journal of Organometallic Chemistry, vol. 19, pp. 203-206 (1969).

Abel et al., "The Synthesis and Characterization of Some (Aminomethyl)Trialkyl- and (Aminomethyl)Triphenyl-Tins," Journal of Organometallic Chemistry, vol. 97, pp. 159-165 (1975).

Armarego, W.L.F., "Purification of Laboratory Chemicals," 6th Edition, Elsevier Inc., pp. xii-743 (2009).

Barreca et al., "MOCVD of SnO2 thin films from a new organometallic precursor," J. Phys. IV France, vol. 9, pp. Pr8-667-Pr8-673 (1999).

Brown et al., "Organoboranes for synthesis. 9. Rapid reaction of organoboranes with iodine under the influence of base. A convenient procedure for the conversion of alkenes into iodides via hydroboration," Tetrahedron, vol. 44, No. 10, pp. 2751-2762 (1988).

Cannon Instrument Company, "Cannon Catalog 2007-2008: Innovations in Viscosity Measurement," pp. 1-74.

Cardineau et al., "EUV Resists based on Tin-Oxo Clusters," Proc. of SPIE, Advances in Patterning Materials and Processes XXXI, vol. 9051, pp. 90511B-1-90511B-12 (2014).

Cardineau et al., "Photolithographic properties of tin-oxo clusters using extreme ultraviolet light (13.5 nm)," Microelectronic Engineering, vol. 127, pp. 44-50 (2014).

Chukhajian et al., "Synthesis of Mixed Secondary and Tertiary Amines," Russian Journal of Organic Chemistry, vol. 56, No. 2, pp. 353-355 (2020).

Cochran et al., "Kinetics of the Protodestannylation of Vinyltrialkyltins and Substituted Vinyltrialkyltins," Organometallics, vol. 1, No. 4, pp. 586-590 (1982).

Das et al., "Synthesis of Oxazolidinones by a Hypervalent Iodine Mediated Cyclization of N-Allylcarbamates," Adv. Synth. Catal., vol. 363, pp. 1646-1650 (2021).

Del Re et al., "Low-LER Tin Carboxylate Photoresists using EUV," Extreme Ultraviolet (EUV) Lithography VI, Proc. of SPIE, vol. 9422 (2015).

Ding et al., "Radical-Induced Formation of Some Siloles and Diazasiloles," J. Org. Chem., vol. 67, No. 25, pp. 8906-8910 (2002).

Eujen et al., "Preparation and Properties of Trifluoromethyl-Substituted Stannanes," J. Organomet. Chem., vol. 434, No. 2, pp. 159-168 (1992) (Abstract Only).

Fallica et al., "Absorption coefficient and exposure kinetics of photoresists at EUV," Proc. of SPIE, vol. 10143, pp. 101430A-1-101430A-11 (2017).

Haitjema et al., "Extreme ultraviolet patterning of tin-oxo cages," Journal of Micro/Nanolithography, MEMS, and MOEMS, vol. 16, No. 3, pp. 033510-1-033510-8 (2017).

Hanssgen et al., "Synthese der ersten mono-t-butylzinn-elementverbindungen," Journal of Organometallic Chemistry, vol. 293, pp. 191-195 (1985).

International Search Report and Written Opinion issued Jun. 10, 2022 in International Application No. PCT/US2021/056936.

Jones et al., "Amino-derivatives of Metals and Metalloids. Part I. Preparation of Aminostannanes, Stannylamines, and Stannazanes," J. Chem. Soc., pp. 1944-1951 (1965).

(56) References Cited

OTHER PUBLICATIONS

Jousseaume et al., "General Routes to Functional Organotin Trichlorides and Trialkoxides Involving the Tricyclohexylstannyl Group," Organometallics, vol. 14, pp. 685-689 (1995).
Khrustalev et al., "New stable germylenes, stannylenes, and related compounds. 8. Amidogermanium(II) and -tin(II) chlorides R2N-E14-Cl (E14=Ge, R=Et; E14=Sn, R=Me) revealing new structural motifs, " Applied Organometallic Chemistry, vol. 21, pp. 551-556 (2007).
Lorberth, J., "Spaltung der zinn-stickstoff-bindung: (dialkylamino)-stannane und ihre reaktionen mit alkylierungsmitteln," Journal of Organometallic Chemistry, vol. 16, No. 2, pp. 235-248 (1969).
Molloy, K. C., "Precursors for the formation of tin(IV) oxide and related materials," Journal of Chemical Research, pp. 549-554 (2008).
Office Action issued Feb. 11, 2022 in U.S. Appl. No. 17/512,944, by Arkles.
Office Action issued Mar. 15, 2023 in TW Application No. 110141022 (partial translation).
Pigarev et al., "The effect of substituents on the structure and reactivity of organogermanium anions," Journal of Organometallic Chemistry, vol. 369, pp. 29-41 (1989).
Sakai et al., "Progress in metal organic cluster EUV photoresists," J. Vac. Sci. Technol. B, vol. 36, No. 6, pp. 06J504-1-06J504-3 (2018).
Search Report issued Aug. 19, 2022 in TW Application No. 110141022.
Search Report issued Mar. 9, 2023 in TW Application No. 110141022.
Seyferth, D., "The Grignard Reagents," Organometallics, vol. 28, No. 6, pp. 1598-1605 (2009).
Stanley et al., "Atmospheric pressure chemical vapour deposition of fluorine-doped tin(IV) oxide from fluoroalkyltin precursors," Applied Organometallic Chemistry, vol. 19, pp. 644-657 (2005).
Tansjo, L., "N-Substituted Alkyltriaminosilanes," ACTA Chemica Scandinavica, vol. 11, No. 10, pp. 1613-1621 (1957).
Tuyen et al., "Nanomechanical and Material Properties of Fluorine-Doped Tin Oxide Thin Films Prepared by Ultrasonic Spray Pyrolysis: Effects of F-Doping," Materials, vol. 12, No. 10, 1665, pp. 1-12 (2019).

Van Den Berghe et al., "A study of the 1H and 119Sn NMR spectra of (CH3)4-nSn(NR2)n compounds (R=CH3, C2H5)," Journal of Organometallic Chemistry, vol. 61, pp. 197-205 (1973).
Van Mol, A.M.B., "Chemical vapour deposition of tin oxide thin films," Ph.D. Thesis, Eindhoven University of Technology, pp. 1-176(2003).
Warner E., "Atomic Layer Deposition of Tin Oxide and Zinc Tin Oxide: Understanding the Reactions of Alkyl Metal Precursors with Ozone," A Dissertation Submitted to the Faculty of University of Minnesota, pp. i-139 (2014).
Wiley-VCH Verlag Gmbh & Co. KGaA, "Distillates (petroleum)(, hydrotreated light," The MAK Collection for Occupational Health and Safety, pp. 1791-1803 (2016). . . .
Zhang et al., "The characterization of fluorine doped tin oxide films by Fourier Transformation Infrared spectrum," Materials Letters, vol. 64, pp. 2707-2709 (2010).
Zuiderweg, F.J., "Laboratory Manual of Batch Distillation," Interscience Publishers, Inc., pp. v-viii, 1 and 74-97 (1957).
Office Action issued Oct. 26, 2023 in U.S. Appl. No. 18/232,945 by Yang et al.
Office Action issued Nov. 20, 2023 in U.S. Appl. No. 18/205,009 by Yang et al.
International Search Report and Written Opinion issued Jan. 16, 2024 in Int'l Application No. PCT/US2023/030045.
Pratihar et al.,"Reactivity and Selectivity of Organotin Reagents in Allylation and Arylation: Nucleophilicity Parameter as a Guide," Organometallics, vol. 30, No. 12, pp. 3257-3269 (2011).
Furniss et al., "Vogel's Textbook of Practical Organic Chemistry: Experimental Techniques," John Wiley & Sons, Inc., New York, pp. 169-190 (1989).
International Search Report and Written Opinion issued Feb. 5, 2024 in Int'l Application No. PCT/US2023/033801.
Office Action issued Mar. 8, 2024 in U.S. Appl. No. 18/205,009 by Yang et al.
Office Action issued Mar. 26, 2024 in TW Application No. 112130357.
Office Action issued Apr. 8, 2024 in TW Application No. 112120747.

\* cited by examiner

CYCLIC AZASTANNANE AND CYCLIC OXOSTANNANE COMPOUNDS AND METHODS FOR PREPARATION THEREOF

CROSS-REFERENCE TO RELATED APPLICATIONS

This application claims priority to U.S. Provisional Application No. 63/412,959, filed Oct. 4, 2022, the disclosures of which is herein incorporated by reference in its entirety.

BACKGROUND OF THE INVENTION

As semiconductor fabrication continues to advance, feature sizes continue to shrink, driving the need for new processing methods. Certain organotin compounds have been shown to be useful in the deposition of tin oxide hydroxide coatings in applications such as extreme ultraviolet (EUV) lithography techniques. For example, alkyl tin compounds provide radiation sensitive Sn—C bonds that can be used to pattern structures lithographically.

Materials used in microelectronic fabrication are required to be extremely pure with tight limits placed on organic contamination (e.g., reaction by-products), metallic contamination, and particulate contamination. Purity requirements are stringent in general, and particularly for lithography applications because the chemical is in contact with the semiconductor substrates and the organometallic impurities in compounds such as $(iPr)Sn(NMe_2)_3$ can affect the properties of the resultant film. Exact targets for purities are determined by a variety of factors, including performance metrics, but typical minimum purity targets are 3N+. Residual metals present in the chemicals can be deposited onto the semiconductor substrate and degrade the electrical performance of the device being fabricated. Typical specification for metals are less than 10 ppb for individual metals and total metal not to exceed ~100 ppb.

Cyclic azasilanes are known to be useful for the functionalization of microelectronic and optoelectronic devices, as well as in ASD applications. Cyclic azastannanes and cyclic oxostannanes, particularly those having high purity, have the potential to be useful in these microelectronic applications as well. However, the ability to prepare and isolate cyclic tin compounds having desired high purity levels has not previously been reported.

BRIEF SUMMARY OF THE INVENTION

A cyclic azastannane according to an embodiment of the disclosure has formula (I):

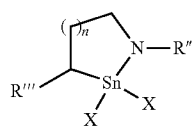

wherein X is OR or NR'$_2$, n is an integer of 1 to 3, R is a primary, secondary, or tertiary alkyl group having 1 to about 5 carbon atoms or a substituted or unsubstituted aryl group having about 6 to about 10 carbon atoms, R' is a primary alkyl group having 1 to about 2 carbon atoms, R" is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, and R'" is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms.

A cyclic oxostannane according to an embodiment of the disclosure has formula (II):

wherein X is OR or NR'$_2$, n is an integer of 1 to 3, R is a primary, secondary, or tertiary alkyl group having 1 to about 5 carbon atoms or a substituted or unsubstituted aryl group having about 6 to about 10 carbon atoms, R' is a primary alkyl group having 1 to about 2 carbon atoms, and R'" is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms.

In a further embodiment, aspects of the disclosure relate to a method for producing a cyclic azastannane having formula (I):

wherein X is OR, n is an integer of 1 to 3, R is a primary, secondary, or tertiary alkyl group having 1 to about 5 carbon atoms or a substituted or unsubstituted aryl group having about 6 to about 10 carbon atoms, R" is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, and R'" is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, the method comprising reacting an aminoalkyltrialkoxystannane or an aminoalkyltriaryloxystannane with a compound selected from the group consisting of HMDZ, an ammonium salt, sulfuric acid, a phosphonium salt, and an organolithium compound.

In a further embodiment, aspects of the disclosure relate to a method for producing a cyclic azastannane having formula (I):

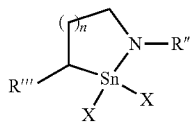

wherein X is NR'$_2$, n is an integer of 1 to 3, R' is a primary alkyl group having 1 to about 2 carbon atoms, R" is a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, and R''' is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, the method comprising heating an aminoalkyltrialkylaminostannane to effect cyclization.

In a further embodiment, aspects of the disclosure relate to a method for producing a cyclic oxostannane having formula (II):

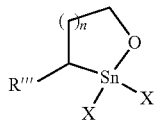

wherein X is OR, n is an integer of 1 to 3, R is a primary, secondary, or tertiary alkyl group having 1 to about 5 carbon atoms or a substituted or unsubstituted aryl group having about 6 to about 10 carbon atoms and R''' is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, the method comprising reacting a trichlorostannyl alcohol with a metal alkoxide to produce a trialkoxystannyl alcohol, and heating to effect cyclization.

In a further embodiment, aspects of the disclosure relate to a method for producing a cyclic oxostannane having formula (II):

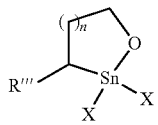

wherein X is NR'$_2$, n is an integer of 1 to 3, R' is a primary alkyl group having 1 to about 2 carbon atoms, and R''' is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, the method comprising reacting (dialkylamino)trimethylsilane with a cyclic oxostannane having formula (II) wherein X is OR and R is a primary, secondary, or tertiary alkyl group having 1 to about 5 carbon atoms.

DETAILED DESCRIPTION OF THE INVENTION

Aspects of the disclosure relate to a new class of cyclic compounds which may be referred to as hydridostannapyrroles and hydridostannafurans, azastannacyclopentanes and oxostannacyclopentanes, or cyclic azastannanes and cyclic oxostannanes. These compounds have desirably high vapor pressure, high water reactivity, and high purity (containing low levels of polyalkyl contaminants after purification). Such compounds contain amide or alkoxy substituents on the tin atom. The cyclic azastannanes and cyclic oxostannanes described herein avoid contamination with polyalkyl tin compounds, tetraalkoxides, and tetraamides after purification.

In some embodiments, the cyclic azastannanes and cyclic oxostannanes are volatile and have particular interest for EUV photoresist applications. For the purposes of this disclosure, a volatile compound is one with sufficient vapor pressure to be transported by a carrier gas such as argon and/or which has the intrinsic ability to diffuse in reaction chambers to a substrate.

The cyclic azastannanes and cyclic oxostannanes according to aspects of the disclosure have the general structures shown in formulas (I) and (II):

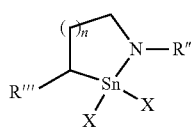

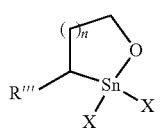

In these five- to seven-membered ring structures, a tin atom is bonded to a carbon atom and a nitrogen or oxygen in the ring, as well as to two alkoxy or dialkylamino groups, the hydrocarbon portion of the ring may be unsubstituted or substituted.

In formulas (I) and (II), X is OR or NR'$_2$, n is an integer from 1 to 3, R is a primary, secondary, or tertiary alkyl group having 1 to about 5 carbon atoms (preferably 1 to about 4 carbon atoms) or a substituted or unsubstituted aryl group having about 6 to about 10 carbon atoms, R' is a primary alkyl group having 1 to about 2 carbon atoms, and R" is hydrogen, a substituted or unsubstituted, primary, secondary, or tertiary, saturated or unsaturated, linear, branched, or cyclic alkyl group having 1 to about 20 carbon atoms, more preferably about 1 to about 5 carbon atoms, a substituted or unsubstituted, branched or linear aralkyl group having about 7 to about 10 carbon atoms, or a substituted or unsubstituted aryl group having 6 to about 10 carbon atoms. R''' may be hydrogen, a substituted or unsubstituted primary, secondary, or tertiary, saturated or unsaturated, linear, branched, or cyclic alkyl group having 1 to about 20 carbon atoms (preferably about 1 to about 6 carbon atoms), a substituted or unsubstituted, branched or linear aralkyl group having about 7 to about 10 carbon atoms, or a substituted or unsubstituted aryl group having about 6 to about 10 carbon atoms, For example, R may be a methyl, ethyl, isopropyl, or t-butyl group, preferably an isopropyl or t-butyl group, R' may be a methyl or ethyl group, and R'' may be hydrogen, a linear or branched alkyl group such as methyl, ethyl, propyl, isopropyl, n-propyl, or t-butyl, an alkenyl, alkynyl, or allyl group, or a phenyl group; presently preferred are methyl, ethyl, and vinyl groups. Examples of R''' include hydrogen, a linear or branched alkyl group such as methyl, ethyl, propyl, isopropyl, n-propyl, or t-butyl, an alkenyl, alkynyl, or allyl group, or a phenyl group; presently preferred are hydrogen, methyl, ethyl, and vinyl groups.

Some specific examples of cyclic azastannane and cyclic oxostannane compounds according to the disclosure include N,N,N',N',1-pentamethyl-1,2-azastannolidine-2,2-diamine; 1-ethyl-N,N,N',N'-tetramethyl-1,2-azastannolidine-2,2-diamine; N,N,N',N'-tetramethyl-1-vinyl-1,2-azastannolidine-2,2-diamine; 2,2-di-tert-butoxy-1-methyl-1,2-azastannolidine; 2,2-di-tert-butoxy-1-ethyl-1,2-azastannolidine; 2,2-di-tert-butoxy-1-vinyl-1,2-azastannolidine; 2,2-dimethoxy-1,2-oxastannolane; 2,2-di-tert-butoxy-1,2-oxastannolane; and 2,2-di-tert-butoxy-3-methyl-1,2-oxastannolane, having the structures shown below.

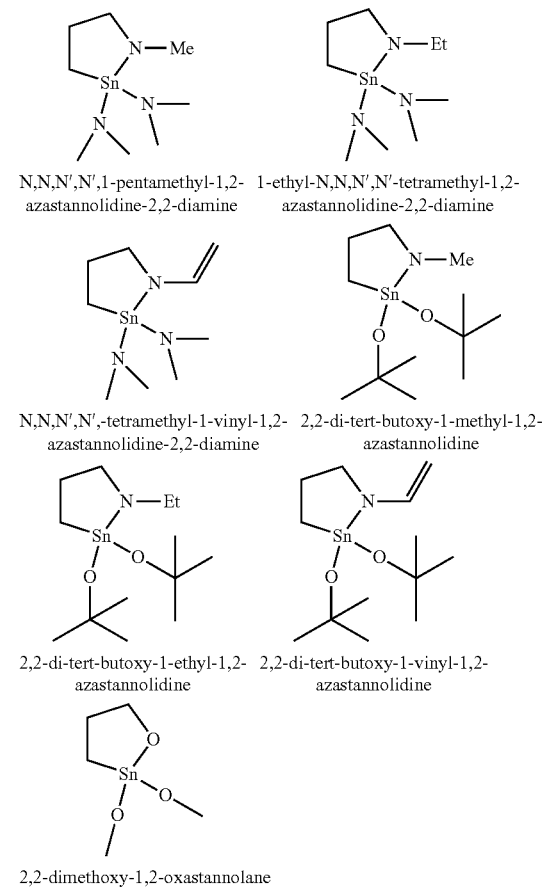

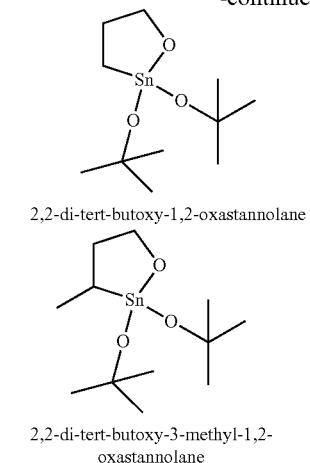

After purification, the compounds having formulas (I) and (II) have high purity, such as greater than about 90 mol %, greater than about 95 mol %, greater than about 97 mol %, greater than about 99 mol %, greater than about 99.2 mol %, greater than about 99.5 mol %, greater than about 99.6 mol %, greater than about 99.7 mol %, greater than about 99.8 mol %, or greater than about 99.9 mol %, and contain less than about 1% tetrakis tin compounds. In preferred embodiments, the compounds having formula (I) further contain less than about 1 mol % diazastannane compounds, less than about 1 mol % tetraalkoxide compounds, and/or less than about 1 mol % tetraamide compounds, such as less than about 0.8 mol %, less than about 0.5 mol %, less than about 0.3 mol %, less than about 0.2 mol %, or less than about 0.1 mol % of one or more of these impurity compounds. For example, N,N,N',N',1-pentamethyl-1,2-azastannolidine-2,2-diamine contains less than 1% 1,6-dimethyl-1,6-diaza-5-stannaspiro[4.4]nonane.

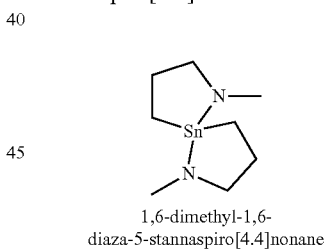

1,6-dimethyl-1,6-diaza-5-stannaspiro[4.4]nonane

The purities of the compounds described herein may be determined by $^{119}$Sn NMR, which can have detection limits as low as 0.05 mol % when testing the sample without dilution in deuterated solvent.

$^{119}$Sn NMR spectroscopy is ideally suited to the quantitative analysis of alkyl tin compounds due to its high sensitivity to small structural changes and large spectral range of 6500 ppm (see Davies et al., Eds.; *Tin Chemistry: Fundamentals, Frontiers, and Applications*; Wiley (2008)). This allows for easy identification and quantification of alkyl tin compounds and their impurities because $^{119}$Sn resonances are highly resolved. $^{119}$Sn NMR suffers from reduced sensitivity compared to other analytical methods such as GC, HPLC, or $^1$H NMR. To improve sensitivity, alkyl tin compounds are analyzed without dilution, and a large number of spectral acquisitions (2000+) are acquired to measure the low levels of impurities described in this work.

The $^{119}$Sn NMR data described herein were obtained using a method similar to the relative purity method described in *J. Med. Chem.* (57, 22, 9220-9231 (2014)). $^{119}$Sn NMR spectra were acquired using inverse-gated $^1$H decoupling with a 400 pulse, one second relaxation delay, and sufficient scans to achieve the required sensitivity. Samples were prepared without dilution in deuterated solvent. Quantitation was performed by integrating all peaks in the spectrum and setting the total peak area to 100. Each peak in the spectrum represents a distinct tin compound and the area of each peak represents the concentration or purity of that compound in mol %.

Methods for Preparing Cyclic Azastannanes

A method for preparing cyclic azastannanes having formula (I) and containing alkoxy or aryloxy groups on the ring tin atom (X is OR) preferably comprises reacting an aminoalkyltrialkoxystannane or an aminoalkyltriaryloxystannane with HMDZ (hexamethyldisilazane), an ammonium salt, sulfuric acid, a phosphonium salt, an organolithium compound, or any similar material which is known in the art or to be developed which reacts favorably with an aminoalkyltrialkoxystannane or aminoalkyltriaryloxystannane to form the desired cyclic azastannane, as shown in the examples below. Thus, the only limitation on the cyclic azastannanes which may be produced according to the method of the invention is the ability to synthesize the aminoalkyltrialkoxystannane or aminoalkyltriaryloxystannane precursor.

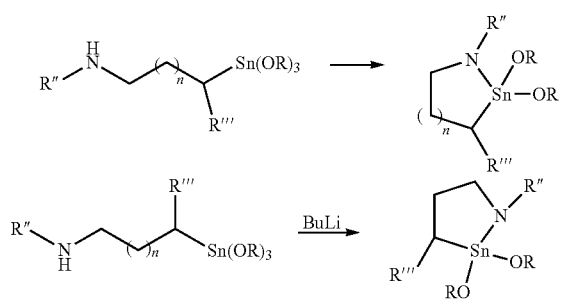

Preferred alkali metal alkyl compounds include organometallic lithium compounds such as the presently preferred butyl lithium. Exemplary phosphonium salts include PyBroP (bromotri(pyrrolidino)phosphonium hexafluorophosphate), BroP (bromotris(dimethylamino)phosphonium hexafluorophosphate), PyBOP ((benzotriazol-1-yloxy)tripyrrolidinophosphonium hexafluorophosphate), and BOP ((benzotriazol-1-yloxy)tris(dimethylamino)phosphonium hexafluorophosphate). Preferred ammonium salts which may be used in accordance with the method described herein include the salts of ammonium with any known anion, such as, without limitation, halide, sulfate, phosphate, and trifluoromethanesulfonate. Particularly preferred ammonium salts include ammonium sulfate and ammonium chloride. Although it is preferred if the ammonium salt is neutral, charged species are also within the scope of the invention.

The reaction is preferably performed in the absence of solvent (neat), but may also be performed in a solution. Preferred solvents include hydrocarbons (such as, but not limited to, hexane, hexanes, heptane, and cyclohexane), aromatics (such as, but not limited to, toluene and xylene), and ethers (such as, but not limited to, THF and $Et_2O$), and mixtures thereof. Particularly preferred solvents include THF, hydrocarbons, and other aprotic solvents. A preferred concentration of the reactants in solvent, if solvent is employed, is about 5% by weight to about 15% by weight, preferably about 7% by weight to about 12% by weight, more preferably about 10% by weight, but may be determined by routine experimentation. It is preferred that the reaction be initially performed at atmospheric pressure and at a temperature of about room temperature to about 150° C., preferably about 120° C. to about 140° C. After the reaction has proceeded for a period of time, preferably about 30-60 minutes, a vacuum is drawn, such as to about 5 to 15 mm Hg, and any alcohol byproduct formed may be removed from the reaction mixtures, such as by condensation in a cold trap during distillation or other separation technique known in the art or to be developed.

Suitable starting materials which may be used in the method according to the present disclosure include aminoalkyltrialkoxystannanes (for preparing cyclic azastannanes in which R is an alkyl group) which contain, in additional to the amino substituent, three alkoxy substituents on tin. The alkoxy substituent may be an alkoxy group preferably containing from 1 to about 5 carbon atoms, and may be a primary, secondary, or tertiary alkoxy group, such as methoxy, ethoxy, propoxy, isopropoxy, t-butoxy, etc., depending on the alkoxy group which is to be present in the cyclic azastannane. If the desired cyclic azastannane contains an aryl or aralkyl group as R, the starting material is an aminoalkyltriaryloxystannane or an aminoalkyltriaralkoxystannane.

The amino substituent in the aminoalkyltrialkoxystannane or aminoalkyltriaryloxystannane preferably contains at least one N—H group which is preferably located about 3 to about 6 carbon atoms from the tin atom, such as aminopropyl to form a five membered ring; the length of the carbon chain determines the size of the ring in the product. The carbon chain is optionally substituted with a group R''' in the alpha position relative to the tin if the final compound has an R''' substituent. The amino substituent may also contain substituted or unsubstituted, saturated or unsaturated, aliphatic hydrocarbon groups or substituted or unsubstituted alkoxy groups, as well as additional substituted or unsubstituted amino groups. For example, the amino substituent may be substituted with an alkyl group, allyl group, or substituted amino group, such as aminoethyl.

Exemplary aminoalkyltrialkoxystannanes include N,N,N',N',N'',N''-hexamethyl-1-(3-(methylamino)propyl)stannanetriamine, 1-(3-(ethylamino)propyl)-N,N,N',N',N'',N''-hexamethylstannanetriamine, N,N,N',N',N'',N''-hexamethyl-1-(3-(vinylamino)propyl)stannanetriamine, N-methyl-3-(tri-tert-butoxystannyl)propan-1-amine, N-ethyl-3-(tri-tert-butoxystannyl)propan-1-amine, and 3-(tri-tert-butoxystannyl)-N-vinylpropan-1-amine.

The aminoalkyltrialkoxystannane starting material may be commercially obtained or prepared, such as by employing the following reaction sequences.

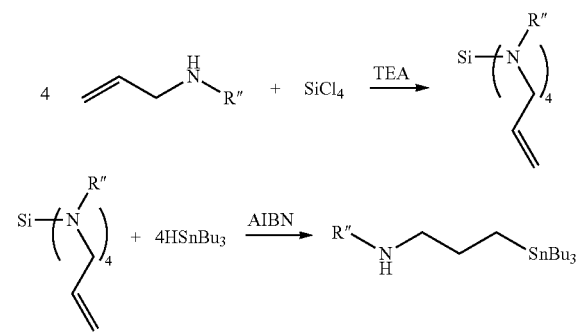

-continued

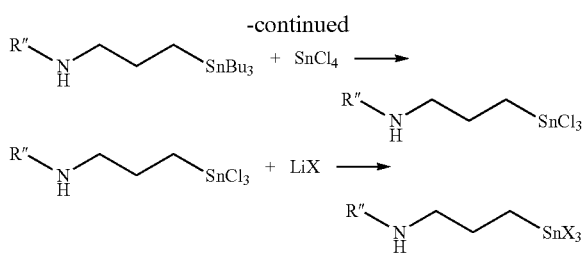

In the above reaction with the aminoalkyltrichlorostannane, X is an alkoxide group, such as methoxide, isopropoxide, or t-butoxide, and is the OR group in the final compound.

Alternatively, the aminoalkyltributyltin compound employed in the third step above may be prepared as follows:

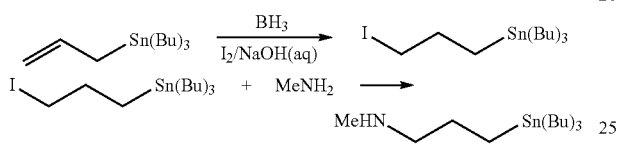

In an analogous fashion, according to another method of the disclosure, cyclic azastannanes having formula (1) containing $NR_2$ substituents on the ring tin atom may be prepared by heating aminoalkyl tin triamide compounds to effect the cyclization by self-molecular transamination, as shown below.

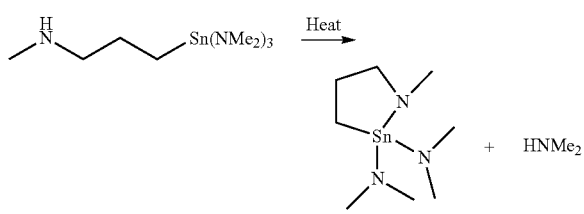

Transamination reactions are versatile process which can occur under mild conditions. While the reactions are reversible, they are usually driven by removing/distilling off the more volatile amine. The reaction temperature range is preferably about 25° C. to about 80° C., depending on the amine by-product boiling point and its solubility in solution. The more preferred operating temperature is about 45° C. to about 65° C., typically achieved by gently refluxing the reaction solvent. In other embodiments, however, the reaction is preferably performed at room temperature. If the temperature is too low, the reaction rate will be too slow, whereas if the temperature is too high, byproducts will be produced.

Preferably, the method is performed in an appropriate solvent. Preferred solvents include hydrocarbons (such as, but not limited to, hexane, hexanes, heptane, and cyclohexane), aromatics (such as, but not limited to, toluene and xylene), and ethers (such as, but not limited to, THF and $Et_2O$), and mixtures thereof. Particularly presently preferred are hydrocarbons and aromatics as the main component of the solvent for removing remaining metal salts by filtration. Toluene and hexane are presently the most preferred solvents for easy removal of the product under vacuum at low temperature following the reaction.

The concentration of the aminoalkyl tin triamide in solution is preferably up to about 3 M, more preferably up to about 2 M, even more preferably up to about 1 M, or up to about 30 wt %, more preferably up to about 20 wt %, even more preferably up to about 15 wt %, and preferably greater than about 1 wt %, greater than about 2 wt %, greater than about 3 wt %, even more preferably greater than about 5 wt %. It has been found that these dilute concentrations provide effective selective intramolecular reaction. On the other hand, the productivity is lower in dilute concentrations in industrial conditions.

The aminoalkyltrialkylamino tin starting material may be prepared in the same fashion described above, employing lithium dialkylamide rather than lithium alkoxide in the reaction with aminoalkyltin trichloride (aminoalkyltrichlorostannane). Exemplary aminoalkyltrichlorostannanes which may be used to form the aminoalkyltrialkylamino tin starting material include N-methyl-3-(trichlorostannyl)propan-1-amine, N-ethyl-3-(trichlorostannyl)propan-1-amine, and 3-(trichlorostannyl)-N-vinylpropan-1-amine, which have the structures shown below.

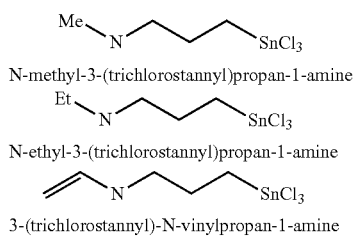

Methods for Preparing Cyclic Oxostannanes

Cyclic oxostannanes containing alkoxy substituents on the ring tin atom may be prepared from trichlorostannyl alcohols (alkyloltrichlorostannanes) by reaction with a metal alkoxide, such as sodium methoxide, to produce the corresponding trialkoxystannyl alcohol, such as 3-(trimethoxystannyl)propan-1-ol, 3-(tri-tert-butoxystannyl)propan-1-ol, or 3-(tri-tert-butoxystannyl)butan-1-ol, followed by heating to effect cyclization. Exemplary alkyloltrichlorostannanes include 3-(trichlorostannyl)propan-1-ol and 3-(trichlorostannyl)butan-1-ol shown below.

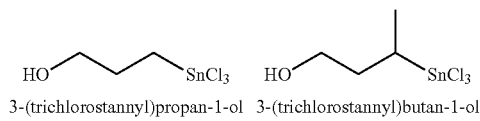

Cyclic oxostannanes containing amino substituents on the ring tin atom may be prepared by reacting a (dialkylamino)trimethylsilane (such as (dimethylamino)trimethylsilane)) with the appropriate cyclic oxostannane having formula (II) wherein X is OR. That is, reaction with (dialkylamino)trimethylsilane converts the alkoxy groups or aryloxy groups on the ring tin atom to amino groups. Appropriate solvents and concentrations for these reactions are as described above. Appropriate temperatures for these reasons may be determined by routine experimentation.

Although silicon and tin are in the same group in the Periodic Table, differences between their reactivities mean that reactions which are effective for producing silane compounds do not work similarly for stannane compounds. For example, aminosilanes can be formed via the direct reaction of chlorosilanes with an amine, whereas amino tin compounds must be formed from lithium amides with tin chloride. In another example, a multi-step synthesis is required to prepare aminoalkyltrichloro tin compounds, whereas the silicon analogs can be simply prepared via hydrosilylation. Further, tin methoxide cannot be prepared by reacting chlorosilane with trimethyl orthoformate and trimethyl orthoacetate, rather, the reaction requires the reaction of tin chloride with MOMe (M=Li, Na, or K). The differences in reactivity between tin and silicon derive in part from the larger size of the tin atom, providing more room for attack from nitrogen and oxygen atoms. Further, tin atoms have empty 5d orbitals which can more easily accept lone pair electrons from oxygen or nitrogen atoms.

All of the method steps for the syntheses of the compounds described herein are preferably performed substantially without light exposure which has detrimental effects on the cyclic azastannane and cyclic oxostannane compounds. Shielding may be accomplished by any method known in the art such as, for example, employing light-shielded containers such as amber glass, metal (SUS) containers, wrapping the container with a light-shielding cover such as cloth, foil or film, using light-shielding coatings, or performing the reactions in a dark room.

The distillations may be performed using a stainless steel column packed with a stainless steel packing material. Alternatively, the distillations may be performed in a light-shielded apparatus comprising glass such as glass equipment, glass-lined equipment, glass-coated equipment, etc. Shielding may be accomplished by any method known in the art such as, for example, employing light-shielded containers such as amber glass, metal (SUS) containers, wrapping the container with a light-shielding cover such as cloth, foil or film, using light-shielding coatings, or performing the distillation in a dark room.

Further aspects of the disclosure relate to a solution containing an organic solvent as described herein and a composition containing organotin compounds having formula (I) and/or formula (II), which may, in some embodiments, be obtained by hydrolysis of a monoorgano tin compound, such as one having formula (I) and/or (II) as described herein. Additional aspects of the disclosure relate to films prepared from or containing a composition containing organotin compounds having formula (I) and/or (II).

The compounds described herein may be used as resist materials after hydrolysis or other reactions such as those known in the art. The compounds described herein may contain a group which is capable of forming an alkyltin oxo-hydroxo-patterning composition which may be hydrolyzed with water or other suitable reagents under suitable conditions to form an alkyltin oxo-hydroxo-patterning composition which may be represented by the formula $R^aSnO_{(3/2-x/2)}(OH)_x$ ($0<x\leq 3$). $R^a$ is an organic substitution connected to a Sn atom which generated by hydrolysis of formula (I) or formula (II). Hydrolysis and condensation reactions that may relate to a compound with hydrolytic groups (X) are shown in the following reactions (R means general alkyl groups):

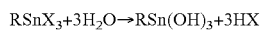

$RSnX_3 + 3H_2O \rightarrow RSn(OH)_3 + 3HX$

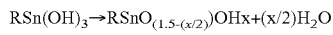

$RSn(OH)_3 \rightarrow RSnO_{(1.5-(x/2))}OHx + (x/2)H_2O$

Alkyl oxohydroxy tin compounds obtained by hydrolysis using a composition containing $RSnX_3$ compounds as described above as raw material and the oxohydroxy tin compounds represented by the formula $R^aSnO_{(3/2-x/2)}(OH)_x$ ($0<x\leq 3$) may be used as an EUV resist material.

A method for obtaining oxohydroxy tin compounds ($R^aSnO$) by hydrolyzing a composition containing a $RSnX_3$ compound may involve, for example, volatilizing a composition containing a $RSnX_3$ compound under heating or reduced pressure, and reacting the vapor generated by volatilizing the composition on a substrate on which the tin composition is deposited, with water vapor, etc. (a dry method). In this method, a thin film containing the tin compound R'SnO may be formed on the substrate.

Another method may involve reacting a composition containing a R'SnX$_3$ compound in solution or in a solid state with water, etc., and hydrolyzing it to obtain the oxohydroxy tin compounds ($R^aSnO$). The oxohydroxy tin compounds ($R^aSnO$) may then be used as a coating solution by dissolving it in an organic solvent, for example. The organic solvent is not limited, however in particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-propanol, 1-butanol, methanol, isopropyl alcohol, 1-propanol), ketones (e.g., methyl ethyl ketone), halogen solvents (e.g., $CH_2Cl_2$, $CHCl_3$) and mixtures thereof. In general, organic solvent selection may be influenced by solubility parameters, volatility, flammability, toxicity, viscosity and potential chemical interactions with other processing materials.

The solution may be applied to a substrate by any coating or printing technique, and a thin film or coating containing oxohydroxy tin compounds ($R^aSnO$) may be formed on the substrate. After the components of the solution are dissolved and combined, the character of the species may change as a result of partial hydration and condensation, especially during the coating process.

The thin film obtained by any of the above methods may be stabilized or partially condensed prior to light irradiation through drying, heating, or other processes. Generally, thin films or coatings have an average thickness of less than about 10 microns, and very thin submicron thin films, e.g., less than about 100 nanometers (nm), even less than about 50 nm or less than about 30 nm, may be desirable for patterning very small features. The resulting thin film or coating may be called a resist because the exposure processes a portion of the composition to be resistant to development/etching.

The thin or coating may be exposed to appropriate radiation, (e.g., extreme ultraviolet, electron beam, deep ultraviolet, or ultraviolet), using a selected pattern or negative portion of the pattern to form a latent image with developer resistant and developer soluble regions. After exposure to the appropriate radiation and prior to development, the thin film or coating may be heated or otherwise reacted to further differentiate the latent image from the non-irradiated areas. The latent image is brought into contact with the developer to form a physical image, i.e., a patterned thin film or coating. The patterned thin film or coating may be further heated to stabilize the remaining patterned coating on the surface. The patterned coating may be used as a physical mask to perform further processing according to the pattern, e.g., etching of the substrate and/or attachment of additional materials. After the patterned resist is used as requested, the remaining patterned coating may be removed at an appropriate point in the processing, but the patterned coating may also be incorporated into the final structure.

The invention will now be described in connection with the following non-limiting prophetic examples.

Example 1 (Prophetic): Synthesis of N-allyl-N-methyl-1,1,1-tris(methyl-12-azaneyl)silanamine (C)

Compound A is prepared according to the method described in *Advanced Synthesis & Catalysis*, 363, 1646 (2021), and compound B is prepared according to the method described in *Russian Journal of Organic Chemistry*, 56, 353 (2020).

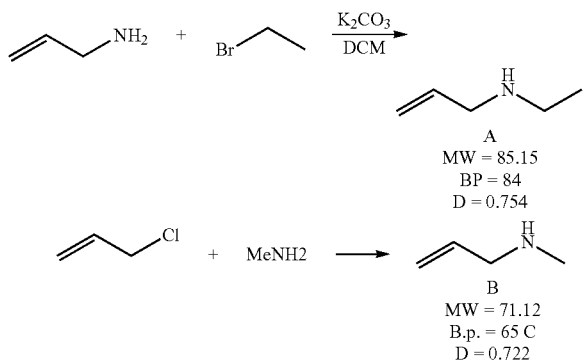

A
MW = 85.15
BP = 84
D = 0.754

B
MW = 71.12
B.p. = 65 C
D = 0.722

N-allyl-N-methyl-1,1,1-tris(methyl-12-azaneyl)silanamine (C) is then prepared from Compound B as follows, as shown in the following scheme. Under $N_2$ 355.6 g (5 moles) allylmethylamine (B) 505.95 g (5 moles) TEA (triethylamine), and 1500 mL DCM (dichloromethane) are charged to a 5 L flask. The mixture is cooled to 0° C. and silicon tetrachloride is added dropwise. After addition, the mixture is warmed to room temperature and stirred overnight. Compound C is then isolated and purified by distillation. An analogous reaction may be performed using compound A instead of compound B.

C
N-allyl-N-methyl-1,1,1-tris(methyl-$\lambda^2$-azaneyl) silanamine

Example 2 (Prophetic): Synthesis of N-methyl-3-(tributylstannyl)propan-1-amine (D)

D
N-methyl-3-(tributylstannyl) propan-1-amine

Following the method of *J. Org. Chem.*, 67(25), 8906 (2002), N-methyl-3-(tributylstannyl)propan-1-amine (D) is prepared according to the scheme above as follows. Under $N_2$, 36.42 g (0.2 mmol) of C, 1979 g (6.8 mmol) of $Bu_3SnH$, 2000 mL of toluene and 98.95 mg (5 wt % of $Bu_3SnH$) of AIBN are charged into a 5 L flask. The mixture is refluxed for 50 hr. Pure compound D is then obtained by distillation.

Example 3 (Prophetic): Synthesis of N-methyl-3-(trichlorostannyl)propan-1-amine (E)

N-methyl-3-(trichlorostannyl)propan-1-amine (E) is prepared according to the scheme above as follows. Under $N_2$, 363.19 (1 mol) of D is charged into a 1 L flask. Tin tetrachloride is added dropwise while controlling the temperature of the reaction mixture below 40° C. After addition the mixture is heated at 70° C. for an additional 4 hrs. Pure compound E is then obtained by distillation.

Example 4 (Prophetic): Synthesis of N,N,N',N',1-pentamethyl-1,2-azastannolidine-2,2-diamine (G)

N,N,N',N',1-pentamethyl-1,2-azastannolidine-2,2-diamine (G) is synthesized according to the scheme above as follows. Under $N_2$, 1500 mL of anhydrous hexanes and 839.9 g of 2.5 M n-BuLi (3.03 mol) are charged into a 5 L flask. 136.6 g of dimethylamine (3.03 mol) are added subsurface at 0~10° C. The reaction mixture is stirred for an additional four hours while warming to room temperature before 396.89 g of compound E (1 mol) premixed in 100 mL toluene is added dropwise at 0~10° C. The resulting mixture is warmed to room temperature over four hours and stirred for an additional four hours at room temperature. The reaction mixture is filtered through sparkler to remove the LiCl byproduct. The salt is rinsed with anhydrous hexanes (2×100 mL). The solvent is removed under reduced pressure and pure compound G is obtained by distillation.

Example 5 (Prophetic): Synthesis of N-methyl-3-(tri-tert-butoxy stannyl)propan-1-amine (H)

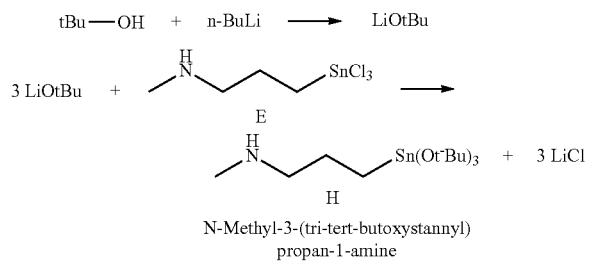

N-methyl-3-(tri-tert-butoxystannyl)propan-1-amine (H) is synthesized according to the scheme above as follows. Under $N_2$, 839.9 g of 2.5 M n-BuLi (3.03 mol) is charged into a 5 L flask and cooled to 0° C. 226.98 g of tertbutyl alcohol (50% in toluene, 253 g) is added subsurface at 0~10° C. The reaction mixture is stirred for an additional four hours while warming to room temperature before 396.89 g of compound E (1 mol) premixed in 100 mL toluene is added dropwise at 0~10° C. The resulting mixture is warmed to room temperature over four hours and stirred for an additional four hours at room temperature. The reaction mixture is filtered through sparkler to remove the LiCl byproduct. The salt is rinsed with anhydrous hexanes (2×100 mL). The solvent is removed under reduced pressure and pure compound H is obtained by distillation.

Example 6 (Prophetic): Synthesis of 2,2-di-tert-butoxy-1-methyl-1,2-azastannolidine (I)

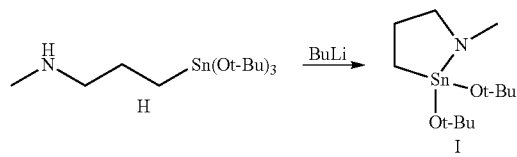

2,2-di-tert-butoxy-1-methyl-1,2-azastannolidine (I) is prepared according to the scheme above as follows. Under $N_2$, 410.19 g of compound H (1 mole) and 800 mL of anhydrous hexanes are charged into a 5 L flask and cooled to 0° C. 277.2 g of BuLi (1 mole) is added dropwise while the temperature is maintained at 0~10° C. After addition, the mixture is warmed to room temperature and stirred overnight. After filtration, the salt is washed twice with an additional 100 mL anhydrous hexane. Pure compound I is obtained by distillation.

Example 7 (Prophetic): Synthesis of 2,2-dimethoxy-1,2-oxastannolane (K)

3-(trichlorostannyl)propan-1-ol (J) is prepared according to the method described in *Organometallics* 14, 685 (1995). 2,2-dimethoxy-1,2-oxastannolane (K) is then prepared according to the scheme above as follows. Under $N_2$, 284.15 g of compound J (1 mole) and 500 mL of THF are charged into a 5 L flask. 648.2 g of NaOMe (25 wt % in MeOH) are added dropwise while maintaining the temperature below 50° C. The mixture is then heated at 50° C. for an additional four hours. After filtration, the salt is washed twice with an additional 100 mL of anhydrous hexane. The solvent is removed by distillation until no MeOH is observed at the distillate. Pure compound K is then obtained by distillation.

Example 8 (Prophetic): Synthesis of N,N,N',N'-tetramethyl-1,2-oxastannolane-2,2-diamine (L)

Under $N_2$ 238.8 g (1 mol) of 2,2-dimethoxy-1,2-oxastannolane (K) and 500 mL of THF are charged into a 5 L flask. 947.46 g of (dimethylamino)trimethylsilane (2.02 mole) are added dropwise and the temperature is maintained below 50° C. The mixture is then heated at about 60-70° C. while removing methoxytrimethylsilane by distillation. After no further observation of methoxytrimethylsilane, the solvent is removed under vacuum. The pure target compound is obtained by distillation.

Example 9 (Prophetic): Purification of Inventive Compounds

The compounds prepared in Examples 1-8 are purified using fractional distillation, resulting in the target compounds having purities of at least 95 mol % and as high as greater than 99 mol %.

I claim:

1. A cyclic azastannane having formula (I):

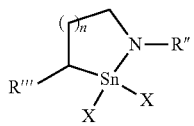

wherein X is OR or NR'$_2$, n is an integer of 1 to 3, R is a primary, secondary, or tertiary alkyl group having 1 to about 5 carbon atoms or a substituted or unsubstituted aryl group having about 6 to about 10 carbon atoms, R' is a primary alkyl group having 1 to about 2 carbon atoms, R" is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms, and R''' is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms.

2. The cyclic azastannane according to claim 1, wherein the cyclic azastannane is N,N,N',N',1-pentamethyl-1,2-azastannolidine-2,2-diamine; 1-ethyl-N,N,N',N'-tetramethyl-1,2-azastannolidine-2,2-diamine; N,N,N',N'-tetramethyl-1-vinyl-1,2-azastannolidine-2,2-diamine; 2,2-di-tert-butoxy-1-methyl-1,2-azastannolidine; 2,2-di-tert-butoxy-1-ethyl-1,2-azastannolidine; or 2,2-di-tert-butoxy-1-vinyl-1,2-azastannolidine.

3. The cyclic azastannane according to claim 1, having a purity of at least about 90 mol %.

4. A cyclic oxostannane having formula (II):

wherein X is OR or NR'$_2$, n is an integer of 1 to 3, R is a primary, secondary, or tertiary alkyl group having 1 to about 5 carbon atoms or a substituted or unsubstituted aryl group having about 6 to about 10 carbon atoms, R' is a primary alkyl group having 1 to about 2 carbon atoms, and R''' is hydrogen, a substituted or unsubstituted primary, secondary, or tertiary, saturated or unsaturated, linear, branched, or cyclic alkyl group having 1 to about 20 carbon atoms, a substituted or unsubstituted, branched or linear aralkyl group having about 7 to about 10 carbon atoms, or a substituted or unsubstituted aryl group having about 6 to about 10 carbon atoms.

5. The cyclic oxostannane according to claim 4, wherein the cyclic oxostannane is, 2-dimethoxy-1,2-oxastannolane; 2,2-di-tert-butoxy-1,2-oxastannolane; and 2,2-di-tert-butoxy-3-methyl-1,2-oxastannolane.

6. The cyclic oxostannane according to claim 4, having a purity of at least about 90 mol %.

7. A method for producing a cyclic azastannane according to claim 1 wherein X is OR, the method comprising reacting an aminoalkyltrialkoxystannane or aminoalkyltriaryloxystannane with a compound selected from the group consisting of HMDZ, an ammonium salt, sulfuric acid, a phosphonium salt, and an organolithium compound.

8. A method for producing a cyclic azastannane according to claim 1 wherein X is NR'$_2$, the method comprising heating an aminoalkyltrialkylaminostannane to effect cyclization.

9. A method for producing a cyclic oxostannane according to claim 4, wherein X is OR, the method comprising reacting a trichlorostannyl alcohol with a metal alkoxide to produce a trialkoxystannyl alcohol, and heating the trialkoxystannyl alcohol to effective cyclization.

10. A method for producing a cyclic oxostannane according to claim 4, wherein X is NR'$_2$, the method comprising reacting a (dialkylamino)trimethylsilane with a cyclic oxostannane having formula (II) wherein X is OR and R is a primary, secondary, or tertiary alkyl group having 1 to about 5 carbon atoms or a substituted or unsubstituted aryl group having about 6 to about 10 carbon atoms.

* * * * *